(12) United States Patent
Kuo et al.

(10) Patent No.: US 6,388,923 B1
(45) Date of Patent: May 14, 2002

(54) VOLTAGE STABILIZER OF EMBEDDED FLASH MEMORY

(75) Inventors: Jew-Yong Kuo, Hsinchu; Albert Sun, Taipei, both of (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 09/829,290

(22) Filed: Apr. 9, 2001

(30) Foreign Application Priority Data

Nov. 23, 2000 (TW) .......................................... 89124860

(51) Int. Cl.$^7$ .............................................. G11C 16/04
(52) U.S. Cl. ................ 365/185.18; 365/185.2; 365/185.21
(58) Field of Search ..................... 365/185.18, 185.2, 365/185.21, 185.01, 189.01

(56) References Cited

U.S. PATENT DOCUMENTS 6,246,613 B1 * 6/2001 Banks .................. 365/185.22

* cited by examiner

Primary Examiner—David Nelms
Assistant Examiner—Mai-Huong Tran
(74) Attorney, Agent, or Firm—J. C. Patents

(57) ABSTRACT

A voltage stabilizer of an embedded flash memory to modulate an input voltage VDD with a wide range of variation to a fixed voltage as an output. The voltage at the bit line of the selected memory cell can be fixed to avoid error access. The voltage stabilizer of the embedded flash memory performs a voltage range inspection using a voltage inspector. Comparing to a standard value, an input voltage higher or lower than the standard value is output from a first terminal or a second terminal, respectively. The input voltage output from the first or second terminals is then stabilized to output a fixed voltage.

5 Claims, 3 Drawing Sheets

VOLTAGE STABILIZER OF EMBEDDED FLASH MEMORY

CROSS-REFERENCE TO RELATED APPLICATION

This application claims the priority benefit of Taiwan application serial no. 89124860, filed Nov. 23, 2000.

BACKGROUND OF THE INVENTION

1. Field of the Invention

The invention relates in general to a voltage stabilizer. More particularly, the invention relates to a voltage stabilizer of an embedded flash memory.

2. Description of the Related Art

During the access of a flash memory, methods to indicate high threshold voltage and low threshold voltage are different. In one conventional method, a reference memory cell near a bit line voltage is compared with a selected memory cell. As shown in FIG. 1, a structure to compare the reference memory cell with the selected memory cell is illustrated. The structure comprises a bit line decoder 10, a word line decoder 12, a memory cell 14, a current-to-voltage converter 16, a reference word line 18, a reference memory cell 20, a reference voltage 22 and a voltage sense amplifier 24.

An output of the bit line decoder 10 is coupled to a drain of the memory cell 14. An output of the word line decoder 12 is coupled to a gate of the memory cell 14. A source of the memory cell 14 is coupled to a ground voltage Vss. The output of the bit line decoder 10 is further coupled to the current-to-voltage converter 16. A gate of the reference memory cell 20 at the other side is coupled to the reference word line 18. A drain of the reference memory cell 20 is coupled to another bit line decoder (not shown), and a source thereof is coupled to the ground voltage Vss. A drain of the reference memory cell 20 is coupled to the reference voltage 22. That is, both the drain of the reference memory cell 22 and the current-to-voltage converter 16 are coupled to the voltage sense amplifier 24.

The above structure is used to detect the Vt distribution of memory cells on a chip, so as to trace the problems in fabrication process and to maintain a correct access. However, the structure is restricted by the variation range of the VDD. When the variation of the VDD exceeds ±10%, the word line voltage dependent on the VDD has a significant variation. Thus, the reference voltage bias node applied to the voltage sense amplifier 24 is shifted to cause an error access.

SUMMARY OF THE INVENTION

The invention provides a voltage stabilizer of an embedded flash memory. After receiving and processing an input voltage, a fixed voltage is output.

The stabilizer of the embedded flash memory comprises a voltage inspector, an annular oscillator, a frequency band interstitial voltage and stabilized clock generator, a switching controller, a charge pump, an NMOS transistor, a first resistor, a second resistor, a comparator, a PMOS transistor, a first capacitor and a second capacitor.

The voltage inspector receives a voltage to perform a range inspection, so as to select a value higher or lower than a standard value. When the value is higher than the standard value, the input voltage is output from a first output terminal. When the value is lower than the standard value, the input voltage is output from a second output terminal.

The annular oscillator generates a clock signal. The frequency band interstitial voltage and stabilized clock generator is coupled to the annular oscillator and the voltage inspector to generate a stabilized clock signal after receiving the clock signal, and to output a frequency band interstitial voltage to the voltage inspector as a power supply.

The switching controller is coupled to the first output terminal of the voltage inspector. When a voltage is input, the switching controller is conducted to output the fixed voltage to the final output terminal. The charge pump is coupled to the second output terminal of the voltage inspector, the frequency band interstitial voltage and stabilized clock generator to receive the stabilized clock signal. When the input voltage is lower than the standard. value, the input voltage is received and charged to a fixed voltage. The fixed voltage is output from the output terminal.

The NMOS transistor has a gate coupled to the second output terminal of the voltage inspector to receive the input voltage and a source coupled to the ground voltage. The first resistor has one terminal coupled to a drain of the NMOS transistor, and the other terminal coupled to one terminal of the second resistor. The other terminal of the second resistor is coupled to the final output terminal. The comparator comprises a first input terminal, a second input terminal, a third input terminal and an output terminal. The first input terminal is to receive the frequency band interstitial voltage, the second input terminal is coupled between the first and the second resistors, and the third input terminal is coupled to an output terminal of the charge pump to control the operation of the comparator. A gate of the PMOS transistor is coupled to the output terminal of the comparator. A source of the PMOS transistor is coupled to the output terminal of the charge pump. A drain of the PMOS transistor is coupled to the final output terminal. The first capacitor C1 is coupled between the source of the PMOS transistor and the ground voltage. The second capacitor C2 is coupled between the final output terminal and the ground voltage.

The frequency band interstitial voltage is 1.25 V. The resistance ratio of the first resistor R1 and the second resistor R2 is 1:3.

Both the foregoing general description and the following detailed description are exemplary and explanatory only and are not restrictive of the invention, as claimed.

DESCRIPTION OF THE PREFERRED EMBODIMENTS

Figure 1:
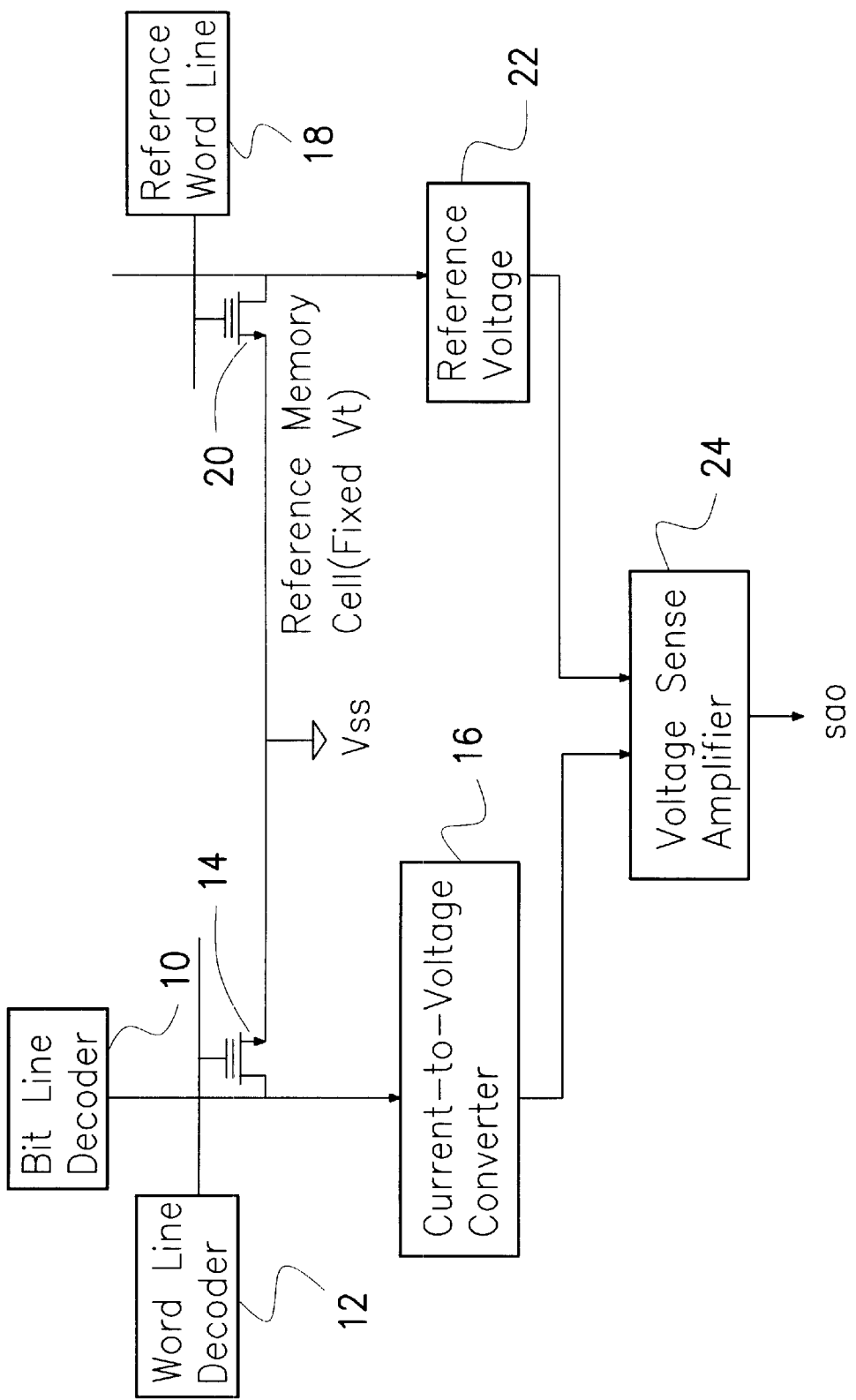
FIG. 1 shows a conventional structure to compare a reference memory cell near a bit line voltage with a selected memory cell.
Figure 2:
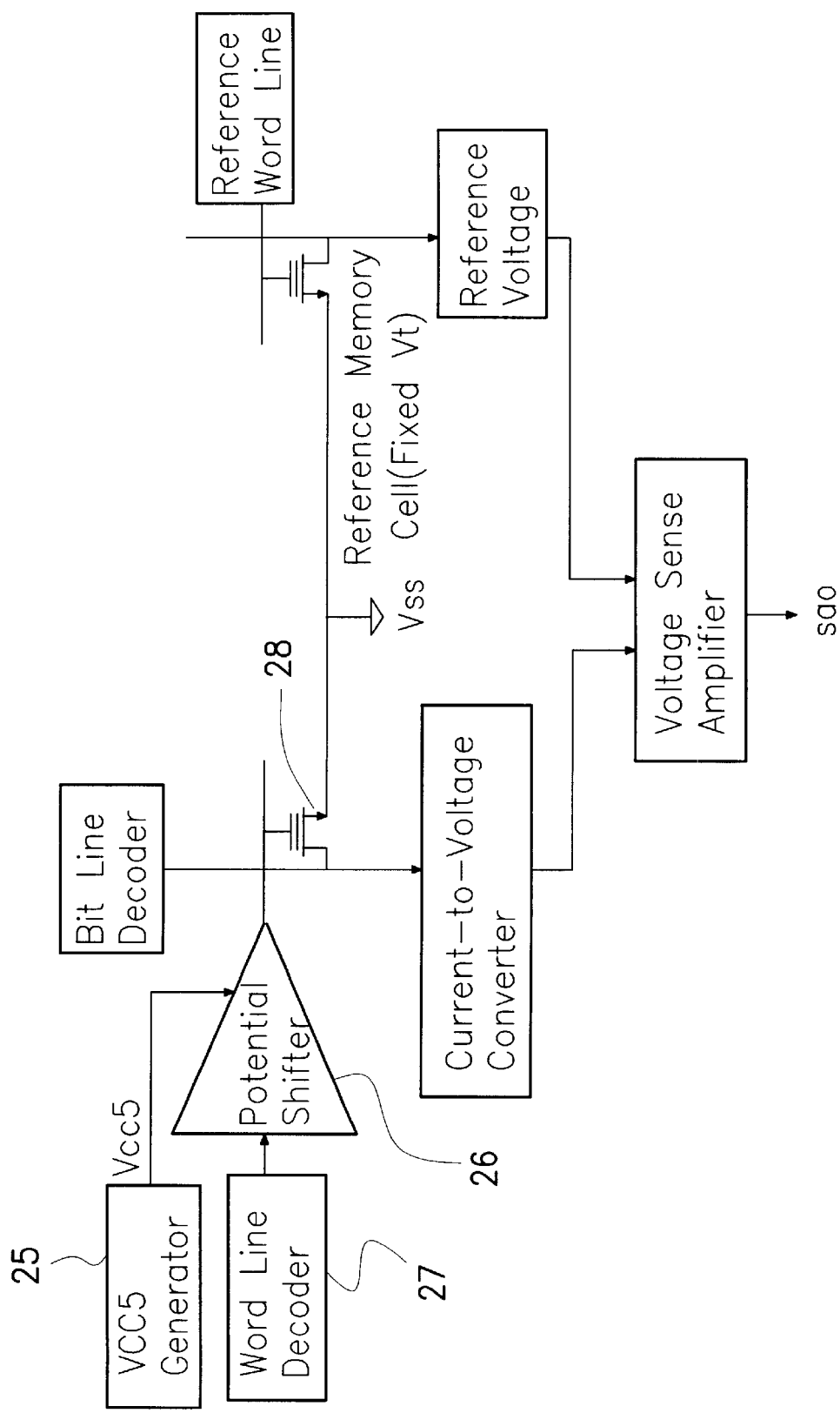
FIG. 2 shows an embodiment of a VCC5 stabilizer of an embedded flash memory to provide a power source for a word line decoder.

As mentioned above, as the embedded flash memory is restricted by the variation limit of VDD±10%, the bias node of the voltage sense amplifier 24 is shifted to cause error access. Therefore, in the invention, a voltage stabilizer of the embedded flash memory is designed to generate a fixed voltage range as shown in FIG. 2. The structures which have been illustrated in FIG. 1 are not repeated here. In FIG. 2, the VCC5 stabilized voltage generator 25, that is, the voltage stabilizer of the embedded flash memory provided by the invention, and the potential shifter 26 are added. As the VCC5 generator 25 constantly generates a fixed voltage VCC5 to the potential shifter 26, accompanied by the output voltage of the word line decoder 27, the low voltage is directly output from the potential shifter 26 to the gate of the memory cell 28. Similarly, as the VCC5 generator 25 generates the fixed voltage VCC5, the high voltage is output from the potential shifter 26 to the gate of the memory cell 28.

Figure 3:
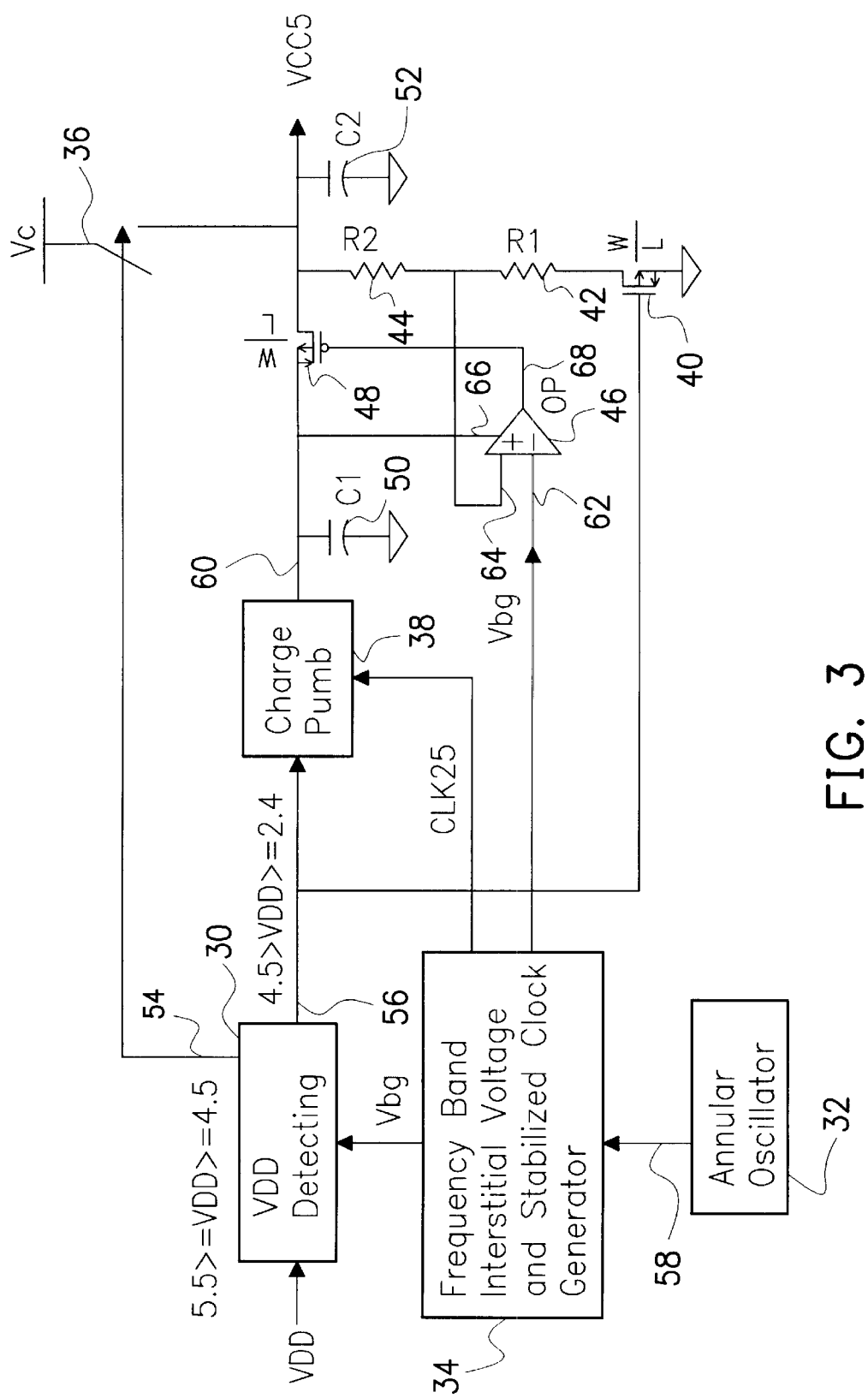
FIG. 3 shows the application of the stabilizer of the embedded flash memory to the bit line of a selected memory cell.

Referring to FIG. 2 and FIG. 3, a detailed description of the fixed voltage VCC5 generated by the VCC5 generator 25, that is, the stabilizer of the embedded flash memory, is given as follows.

The stabilizer of the embedded flash memory comprises a voltage inspector 30, an annular oscillator 32, a frequency band interstitial voltage and stabilized clock generator 34, a switching controller 36, a charge pump 38, an NMOS transistor 40, a first resistor 42, a second resistor 44, a comparator 46, a PMOS transistor 48, a first capacitor 50 and a second capacitor 52.

During the operation, an input voltage VDD with a wide variation range (for example, ranging from about 2.4V to about 5.5V) is input to the voltage inspector 30. A voltage range inspection is performed with a determined standard value (for example, 4.5 V in this embodiment). When the input voltage VDD is higher than the standard value, that is, 5.5≧VDD≧4.5, the input voltage VDD is referred as a normal voltage and output from a first output terminal 54 of the voltage inspector 30. When the input voltage VDD is lower than the standard value, that is 4.5≧VDD≧2.4, the input voltage is referred as a low voltage and output from a second output terminal 56 of the voltage inspector 30. Meanwhile, the annular oscillator 32 generates a clock signal Clock to the frequency band interstitial voltage and stabilized clock generator 34 which is coupled to the annular oscillator 32. After receiving the clock signal Clock, a stabilized clock signal CLK25 is generated and connected to the voltage inspector 30 to provide a frequency band interstitial voltage Vbg as a power source. The frequency band interstitial voltage Vbg is fixed as 1.25.

When the input voltage VDD is lower than 5.5V and higher than 4.5V, the input voltage VDD is output from the first output terminal 54 to the switching controller 36. The switching controller 36 is thus conducted to directly output a fixed voltage Vc to a final output terminal VCC5. When the input voltage VDD is lower than 4.5V and higher than 2.4V, the input voltage VDD is output to the charge pump 38. With the operation of the stabilized clock signal CLK25 input from the frequency band interstitial voltage clock generator 34, the input voltage VDD lower than 4.5V is charged to a sufficient high voltage (larger than 5V). A fixed voltage VCC5 of about 4.75V±5% is output from the output terminal 60. In this embodiment, the fixed voltage has a stabilized range between about 2.4V and about 5.6V and the variation according to temperature is about 50 ppm/° C.

In addition, the gate of the NMOS transistor 40 also receives the input voltage VDD output from the second output terminal 56 of the voltage inspector 30. The source of the NMOS transistor 40 is coupled to a ground voltage, and a drain of the NMOS transistor 40 coupled to one terminal of the first resistor (R1) 42 that has the other terminal coupled to one terminal of the second resistor (R2) 44. The other terminal of the second resistor 44 is coupled to a final output terminal VCC5. The above first resistor (R1) 42 and the second resistor (R2) 44 are 1:3.

The comparator 46 comprises a first input terminal 62 to receive the frequency band interstitial voltage Vbg, a second input terminal 64 coupled between the first and the second resistors 42 and 44, and a third input terminal 66 coupled to an output terminal 60 of the charge pump 38. A gate of the PMOS transistor 48 is coupled to the output terminal 68 of the comparator 46. A drain of the PMOS transistor 48 is coupled to the output terminal 60 of the charge pump 38. A source of the PMOS transistor 48 is coupled to the final output terminal VCC5. The first capacitor 50 is coupled between the source of the PMOS transistor 48 and the ground voltage. The second capacitor 52 is coupled between the final output terminal VCC5 and the ground voltage.

When the input voltage VDD is lower than 4.5V and higher than 2.4V, the high voltage output from the output terminal 60 of the charge pump 38 is a power supply for operation of the comparator 46. Meanwhile, the input voltage VDD is fed into the gate of the NMOS transistor 40 to conduct the NMOS transistor 40. The second capacitor 52 is charged to the fixed voltage Vc (about 4.75V). When the voltage VCC5 is too low (<4.5V), the discharge is performed from the second resistor (R2) 44 and the first resistor (R1) 42. The voltage at the second output terminal 64 between the first resistor 42 and the second resistor 44 is lower then 1.2V. The frequency band interstitial voltage Vbg is fixed as 1.25V. The output of the comparator 46 is maintained at "0". As a result, the PMOS transistor 48 is conducted. The output voltage of the output terminal 60 of the charge pump 38 is pulled up and output to the final terminal VCC5. When the voltage VCC5 is high (>4.75V), the second output terminal 64 has a voltage higher than 1.2V. The output of the comparator 46 is "1". As a result, the PMOS transistor 48 is turned off. The charging process to the capacitor C2 is stopped. Therefore, the voltage VCC5 is maintained at the fixed voltage (about 4.75V±5%). If the input voltage is raised to higher than the normal voltage 4.5V, the second output terminal 56 stops outputting the input voltage, so that the NMOS transistor 40 can not be conducted, and the input voltage is not supplied to the charge pump 38 for operation. The above process is no longer performed. In contrast, the process is performed via the first terminal 54. The voltage VCC5 is directly supplied by the fixed voltage Vc to save power consumption when the normal voltage source is not operating.

In the above voltage stabilizer of the embedded flash memory, the VDD with a large variation is output within a fixed voltage range, according to whether it is lower or higher than a fixed voltage. To further depict the invention, a description, FIG. 2, combining the voltage stabilizer of the embedded flash memory with the structure as shown in FIG. 1 is given here. The difference between FIG. 1 and FIG. 2 is the addition of the VCC5 generator 25 and the potential shifter 26. Since the VCC5 generator 25 constantly generates a fixed voltage to the potential shifter 26, the word line decoder 27 outputs a voltage (low voltage 0 and high voltage VDD). The low voltage 0 is directly output from the potential shifter 26 to the gate of the memory cell 28. The high voltage is the Voltage VCC5 generated by the VCC5 generator and is output from the potential shifter 26 to the gate of the memory cell 28.

According to the above, the voltage stabilizer of the embedded flash memory modulates a voltage VDD with a significant variation to a fixed voltage to be output. The voltage received at the bit line is thus fixed to avoid error access.

Other embodiments of the invention will appear to those skilled in the art from consideration of the specification and practice of the invention disclosed herein. It is intended that the specification and examples be considered as exemplary only, with a true scope and spirit of the invention being indicated by the following claims.

What is claimed is:

1. A voltage stabilizer of an embedded flash memory to output a fixed voltage at a final output terminal after receiving and processing an input voltage ranged between a first voltage level and a second voltage level, wherein the second voltage level is higher than the first voltage level, the voltage stabilizer comprising:

a voltage inspector, to receive the input voltage and to perform a range inspection, so as to determine whether the input voltage is higher or lower than a standard value, and when the input voltage is higher than the standard value, the input voltage is output from a first output terminal of the voltage inspector, and when the input voltage is lower than the standard value, the input voltage is output from a second output terminal of the voltage inspector;

an annular oscillator, to generate a clock signal;

a frequency band interstitial voltage and stabilized clock generator, coupled to the annular oscillator and the voltage inspector, to generate a stabilized clock signal after receiving the clock signal, and to output a frequency band interstitial voltage to the voltage inspector as a power source;

a switching controller, coupled to the first output terminal of the voltage inspector, when the input voltage is input, the switching controller is conducted to output the fixed voltage to the final output terminal;

a charge pump, coupled to the second output terminal of the voltage inspector, the frequency band interstitial voltage and stabilized clock generator to receive the stabilized clock signal, and when the input voltage is lower than the standard value, the charge pump receives the input voltage to charge up to a sufficient voltage, and the fixed voltage is output from an output terminal of the charge pump, wherein the fixed voltage has a stabilized range between the first voltage level and the second voltage level;

an NMOS transistor, comprising a gate coupled to the second output terminal of the voltage inspector to receive the input voltage and a source coupled to a ground voltage;

a first resistor, comprising one terminal coupled to a drain of the NMOS transistor;

a second resistor, with one terminal coupled to the other terminal of the first resistor, and the other terminal coupled to the final terminal;

a comparator, comprising a first input terminal, a second input terminal, a third input terminal and an output terminal, wherein the first input terminal receives the frequency band interstitial voltage, the second input terminal is coupled between the first and the second resistors, and the third input terminal is coupled to the output terminal of the charge pump to control an operation of the comparator;

a PMOS transistor, comprising a gate coupled to the output terminal of the comparator, a source coupled to the output terminal of the charge pump, and a drain coupled to the final output terminal;

a first capacitor, coupled between the source of the PMOS transistor and ground voltage; and a second capacitor, coupled to the final output terminal and the ground voltage.

2. The voltage stabilizer according to claim 1, wherein the first voltage level is about 2.4V.

3. The voltage stabilizer according to claim 1, wherein the second voltage level is about 5.6V.

4. The voltage stabilizer according to claim 1, wherein the frequency band interstitial voltage is about 1.25V.

5. The voltage stabilizer according to claim 1, wherein the first resistor and the second resistor has a resistance ratio of about 1:3.

* * * * *